(12) United States Patent
Sugawara et al.

(10) Patent No.: US 10,996,388 B2
(45) Date of Patent: May 4, 2021

(54) MANUFACTURING METHOD OF PHASE DIFFERENCE ELEMENT, PHASE DIFFERENCE ELEMENT, AND PROJECTION IMAGE DISPLAY DEVICE

(71) Applicant: Dexerials Corporation, Tokyo (JP)

(72) Inventors: Junichi Sugawara, Tokyo (JP); Yoshi Kanega, Tokyo (JP); Toshiaki Sugawara, Tokyo (JP)

(73) Assignee: Dexerials Corporation, Tokyo (JP)

( * ) Notice: Subject to any disclaimer, the term of this patent is extended or adjusted under 35 U.S.C. 154(b) by 147 days.

(21) Appl. No.: 16/508,968

(22) Filed: Jul. 11, 2019

(65) Prior Publication Data

US 2020/0018882 A1 Jan. 16, 2020

(30) Foreign Application Priority Data

Jul. 13, 2018 (JP) .............................. JP2018-133274

(51) Int. Cl.
*G02B 5/30* (2006.01)
*G03B 21/20* (2006.01)
(Continued)

(52) U.S. Cl.
CPC ........ *G02B 5/3083* (2013.01); *C03C 17/3417* (2013.01); *C23C 16/402* (2013.01); *C23C 16/45525* (2013.01); *C23C 16/50* (2013.01); *G02B 1/14* (2015.01); *G03B 21/2073* (2013.01); *C03C 2217/212* (2013.01);
(Continued)

(58) Field of Classification Search
CPC ........... G02F 21/13363; G02F 2413/10; G02B 21/2073; C23C 16/402; C23C 16/45525; C23C 16/50
See application file for complete search history.

(56) References Cited

U.S. PATENT DOCUMENTS

2007/0092662 A1\* 4/2007 Matsuno ................ G02B 1/105
428/1.3
2014/0377886 A1 12/2014 Koyanagi et al.
(Continued)

FOREIGN PATENT DOCUMENTS

JP 2007310052 A 11/2007
JP 2011059715 A 3/2011
JP 2015008210 A 1/2015

*Primary Examiner* — William C. Dowling
(74) *Attorney, Agent, or Firm* — Osha Bergman Watanabe & Burton LLP

(57) ABSTRACT

To provide a manufacturing method of a phase difference element which is superior in moisture resistance. After forming an optically anisotropic layer by way of oblique vapor deposition on a substrate, the optically anisotropic layer is covered by a protective layer made by depositing an inorganic compound by way of an atomic layer deposition method. More specifically, established is a manufacturing method of a phase difference element containing a transparent substrate, optically anisotropic layer containing a birefringent film and a protective layer, the method including: an optically anisotropic layer formation step of forming an optically anisotropic layer by forming a birefringent film by way of oblique vapor deposition; and a protective layer formation step of forming a protective layer by depositing an inorganic compound by way of an atomic layer deposition method.

20 Claims, 5 Drawing Sheets

(51) Int. Cl.
*G02B 1/14* (2015.01)
*C23C 16/40* (2006.01)
*C23C 16/455* (2006.01)
*C23C 16/50* (2006.01)
*C03C 17/34* (2006.01)

(52) U.S. Cl.
CPC .. *C03C 2217/213* (2013.01); *C03C 2217/218* (2013.01); *C03C 2217/734* (2013.01); *C03C 2217/78* (2013.01); *C03C 2218/153* (2013.01)

(56) References Cited

U.S. PATENT DOCUMENTS

| | | | |
|---|---|---|---|
| 2019/0235295 A1* | 8/2019 | Sugawara | G02F 1/13363 |
| 2020/0081287 A1* | 3/2020 | Sugawara | G02B 5/3058 |
| 2020/0284964 A1* | 9/2020 | Sugawara | G02F 1/13363 |

* cited by examiner ously vapor-deposited film of dielectric material on a
MANUFACTURING METHOD OF PHASE DIFFERENCE ELEMENT, PHASE DIFFERENCE ELEMENT, AND PROJECTION IMAGE DISPLAY DEVICE This application is based on and claims the benefit of priority from Japanese Patent Application No. 2018-133274, filed on 13 Jul. 2018, the content of which is incorporated herein by reference.

BACKGROUND OF THE INVENTION

Field of the Invention

The present invention relates a manufacturing method of a phase difference element represented by ½ wave plate or ¼ wave plate, a phase difference element, and a projection image display device.

Related Art

Conventionally, an optical element made by forming a obliquely vapor-deposited film of dielectric material on a transparent substrate surface has been known. Oblique vapor deposition is a method of forming a film by inclining a substrate surface relative to a flying direction of vapor-deposited material, and the structure of this vapor-deposited film is observed as a columnar structure in which a collection of fine columns is inclined by a fixed angle relative to the substrate surface. The density of this column has anisotropy in-plane, and the refractive index also has in-plane anisotropy. As a result thereof, a birefringence phenomenon occurs in the obliquely vapor-deposited film.

Such a obliquely vapor-deposited film is used in an optically element of ¼ wave plate, ½ wave plate, etc. by way of this birefringence phenomenon. For example, Patent Document 1 discloses a phase difference element having a obliquely vapor-deposited film with main components of silicon dioxide ($SiO_2$) or titanium dioxide ($TiO_2$) (refer to Patent Document 1).

In addition, in a liquid crystal display device, in order to improve the contrast characteristics and viewing angle characteristics, optical compensation technology using a phase difference compensation element has been used. As such phase difference compensation elements, for example, a phase difference compensation element has been proposed made using tantalum pentoxide ($Ta_2O_5$) as the component of the obliquely vapor-deposited film (refer to Patent Document 2).

However, the obliquely vapor-deposited films described in Patent Documents 1 and 2, as a result of the vapor-deposited material being deposited from an oblique direction, becomes a structure having an inclined columnar part and a void part consisting of an air layer between columnar parts. Then, if moisture penetrates the void part between columnar parts, cracks or peeling occurs, and thus problems arise in durability.

In addition, Patent Document 3 discloses forming a protective layer on a obliquely vapor-deposited film by way of the CVD method. However, moisture infiltration prevention has still not been sufficient by the method of Patent Document 3.

Patent Document 1: Japanese Unexamined Patent Application, Publication No. 2007-310052

Patent Document 2: Japanese Unexamined Patent Application, Publication No. 2011-59715

Patent Document 3: Japanese Unexamined Patent Application, Publication No. 2015-08210

SUMMARY OF THE INVENTION

The present invention has been made taking account of the above-mentioned background art, and an object thereof is to provide a manufacturing method of a phase difference element which is superior in moisture resistance.

The present inventors found that a phase difference element superior in moisture resistance can be obtained if forming an optically anisotropic layer by way of oblique vapor deposition on a substrate, followed by covering the optically anisotropic layer by a protective layer made by depositing an inorganic compound by an atomic layer deposition method, thereby arriving at completion of the present invention.

More specifically, the present invention is a manufacturing method of a phase difference element, the phase difference element including a transparent substrate, an optically anisotropic layer containing a birefringent film, and a protective layer, the method including: an optically anisotropic layer formation step of forming an optically anisotropic layer by forming a birefringent film; and a protective layer formation step of forming a protective layer by depositing an inorganic compound by way of an atomic layer deposition method so as to contact the optically anisotropic layer.

The optically anisotropic layer may be formed by oblique vapor deposition in the optically anisotropic layer formation step.

The optically anisotropic layer may at least contain $Ta_2O_5$ or $HfO_2$.

The optically anisotropic layer may consist of a mixture of $Ta_2O_5$ and $TiO_2$, and a proportion of a number of Ti atoms relative to a total of the number of Ti atoms and a number of Ta atoms (Ti/(Ta+Ti)*100) may be set to at least 4.0% and no more than 30%.

The inorganic compound may contain at least one selected from the group consisting of $TiO_2$, $SiO_2$, $Ta_2O_5$, $Al_2O_3$, $ZrO_2$, $Nb_2O_5$ and $HfO_2$.

The thickness of the protective layer may be at least 2 nm.

The protective layer may consist of at least two layers.

The method may alternately repeat for a plurality of times the optically anisotropic layer formation step and the protective layer formation step.

The method may further include a $SiO_2$ layer formation step of forming a layer consisting of $SiO_2$ on the protective layer.

The layer consisting of $SiO_2$ may be formed by a plasma CVD method in the $SiO_2$ layer formation step.

The method may further include an antireflection layer formation step of laminating at least two types of dielectric films of different refractive index to form an antireflection layer.

The dielectric film may contain at least one selected from the group consisting of $TiO_2$, $SiO_2$, $Ta_2O_5$, $Al_2O_3$, $CeO_2$, $ZrO_2$, $ZrO$, $Nb_2O_5$ and $HfO_2$.

The method may further include a matching layer formation step of forming a matching layer so as to contact the transparent substrate.

The transparent substrate may be one selected from the group consisting of glass, quartz, crystal and sapphire.

In addition, the present invention is a phase difference element including: a transparent substrate; an optically anisotropic layer containing a birefringent film; and a protective layer which is an atomic layer deposited layer of inorganic compound contacting the optically anisotropic layer.

The birefringent film may be a obliquely vapor deposited film.

In addition, the present invention is a projection image display device including the above-mentioned phase difference element.

Furthermore, the present invention is a projection image display device including: a light source which outputs light; a light modulation device; a projection optical system which projects modulated light; and the above-mentioned phase difference element which is disposed in a light path between the light source and the projection optically system.

According to the present invention, it is possible to obtain a phase difference element that is superior in moisture resistance.

DETAILED DESCRIPTION OF THE INVENTION

Hereinafter, an embodiment of the present invention will be explained by referencing the drawings.

Manufacturing Method of Phase Difference Element

In a manufacturing method of a phase difference element of the present invention which at least includes a transparent substrate, an optically anisotropic layer including a birefringent film and a protective layer, the method at least includes: an optically anisotropic layer formation step of forming a birefringent film to form an optically anisotropic layer; and a protective layer formation step of depositing an inorganic compound by way of an atomic layer deposition method to form a protective layer so as to contact the obtained optically anisotropic layer.

Figure 1:
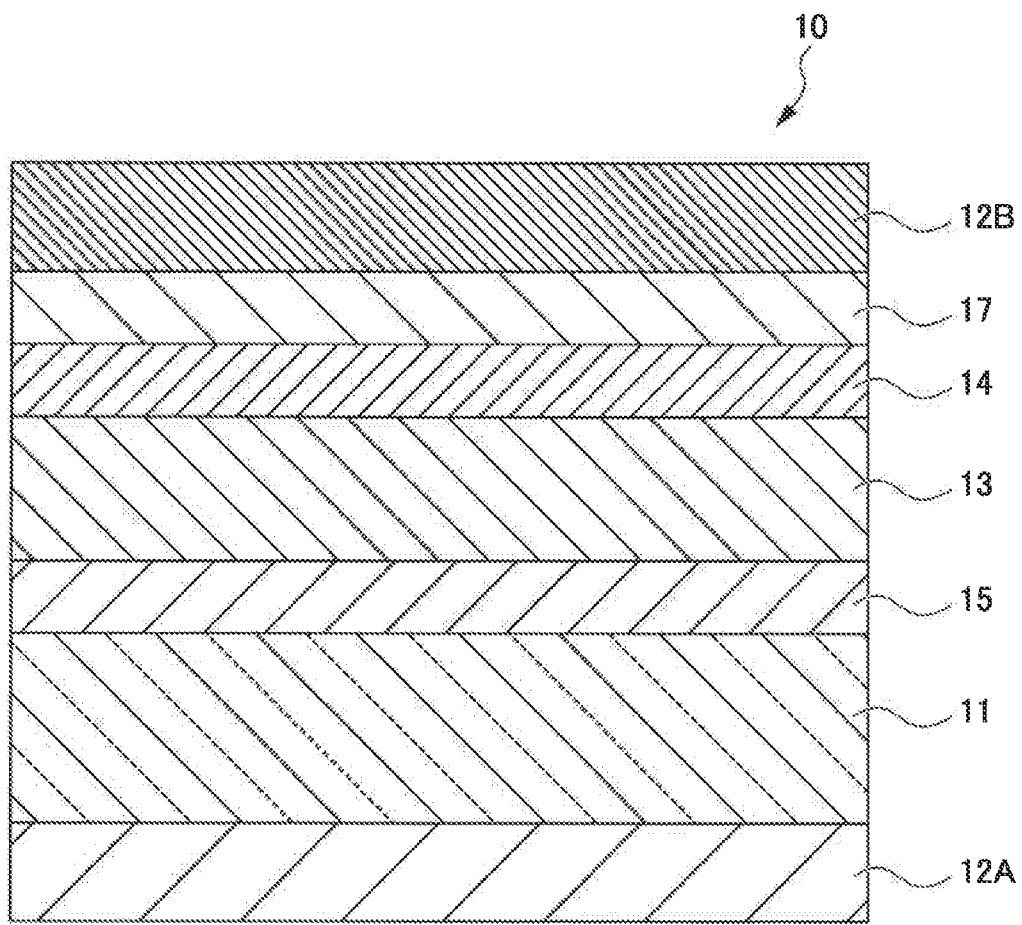
FIG. 1 is a cross-sectional schematic diagram of a phase difference element according to an embodiment of the present invention.

FIG. 1 is a cross-sectional schematic diagram of a phase difference element 10 according to an embodiment obtained by the manufacturing method of the present invention. As shown in FIG. 1, the phase difference element 10 according to the present embodiment includes a transparent substrate 11, a first antireflection layer 12A, an optically anisotropic layer 13, a protective layer 14, a matching layer 15, a SiO$_2$ layer 17, and a second antireflection layer 12B. It should be noted that phase difference element according to the present invention may at least include the transparent substrate, optically anisotropic layer including a birefringent film, and protective layer.

Optically Anisotropic Layer Formation Step

The optically anisotropic layer formation step in the manufacturing method of the phase difference element of the present invention is a step of forming an optically anisotropic layer by forming a birefringent film. The birefringent film by oblique vapor deposition may be directly formed on the transparent film, or another layer may be laminated on the transparent substrate, and then may be formed on this other layer.

Transparent Substrate

The transparent substrate constituting the phase difference element is not particularly limited so long as having transmittance to light of the desired wavelength band of use. As the material of the transparent substrate, for example, glass, quartz, crystal, sapphire, etc. can be exemplified. As the shape of the transparent substrate, quadrilateral is common; however, a shape suited to the purpose may be selected as appropriate. In addition, the thickness of the transparent substrate, for example, is preferably in the range of 0.1 to 3.0 mm.

In the phase difference element 10 shown in FIG. 1, the transparent substrate 11 is arranged between the first antireflection layer 12A and the matching layer 15.

Optically Anisotropic Layer

The optically anisotropic layer formed in the optically anisotropic layer formation step includes a birefringent film. Even if the birefringent film is a single layer film, a plurality of films may be deposited. The optically anisotropic layer becomes a layer realizing the phase difference in the phase difference element of the present invention.

In the phase difference element 10 shown in FIG. 1, the optically anisotropic layer 13 is arranged between the matching layer 15 and the protective layer 14.

Figure 3:
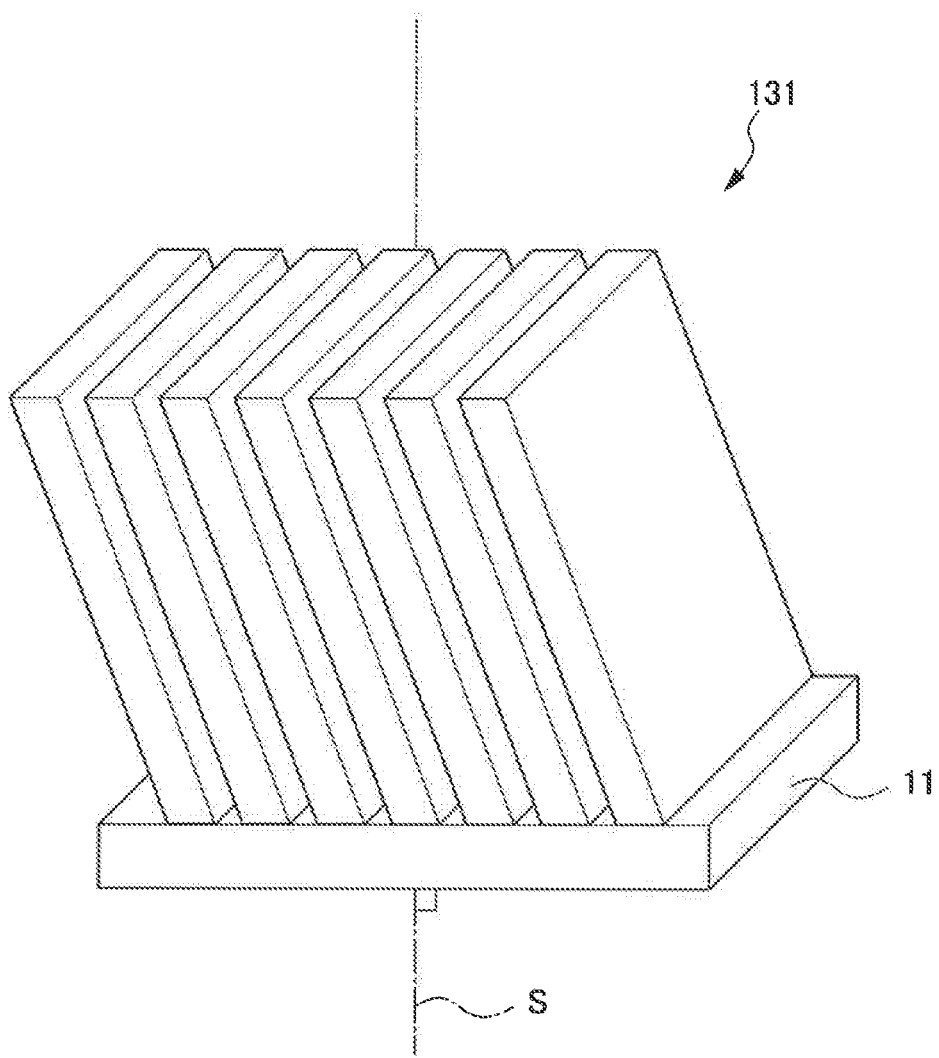
FIG. 3 is a perspective schematic diagram of a birefringent film of the present invention.

FIG. 13 is a perspective schematic view showing an embodiment of the birefringent film included in the optically anisotropic layer. As shown in FIG. 3, a birefringent film 131 included in the optically anisotropic layer 13 formed by oblique vapor deposition is a film formed by depositing in a sloped direction relative to the substrate normal line S, which is a direction orthogonal to the surface of the transparent substrate 1 (hereinafter referred to as substrate normal line direction).

The optically anisotropic layer formation step of the present invention may either form only one birefringent film consisting of such a film, or may form the optically anisotropic layer by depositing a plurality of birefringent films.

The birefringent film is preferably formed by oblique vapor deposition. In the case of depositing by oblique vapor deposition, since formed by depositing at a sloped angle relative to the substrate normal line of the transparent substrate, the angle of the corner formed by the film formation direction of the inorganic material constituting the birefringent film and the surface of the transparent substrate is not 90 degrees.

It should be noted that, in the case of depositing a plurality of birefringent films, a plurality of times of oblique vapor deposition is repeatedly carried out changing the film formation direction to obtain the final optically anisotropic layer. As the method of changing the film formation direction, for example, a method of rotating the transparent substrate to a predetermined angle in an in-plane direction can be exemplified.

Figure 4:
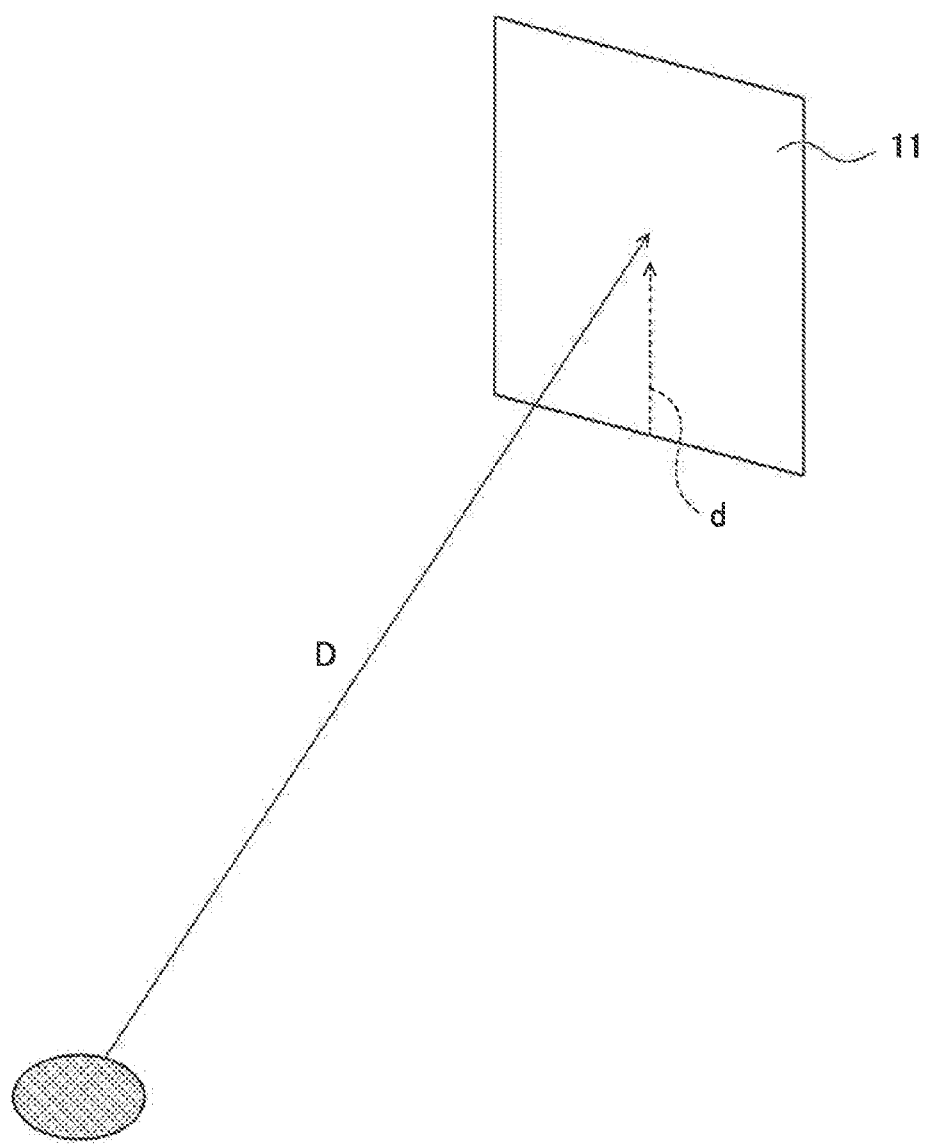
FIG. 4 is a view showing an orientation of a line segment projecting a film formation direction of the birefringent film onto a surface of a transparent substrate.

FIG. 4 is a view showing an orientation of a line segment projecting the film formation direction of the birefringent film onto the surface of the transparent substrate. In the case of forming the birefringent film from the vapor deposition source towards the transparent substrate 11 in the vapor deposition direction D, the orientation of the line segment projecting the film formation direction of the birefringent film onto the surface of the transparent substrate is shown by d.

The optically anisotropic layer formed by the manufacturing method of the phase difference element of the present invention consists of inorganic material. As the inorganic material serving as the raw material, a dielectric material is preferable, for example, and oxides containing at least one selected from the group consisting of Si, Nb, Zr, Ti, La, Ta, Al, Hf and Ce can be exemplified. Thereamong, containing $Ta_2O_5$ or $HfO_2$ is preferable due to the Δn (refractive index difference) being large.

The material of the optically anisotropic layer, due to reducing the optical loss and increasing transmission, is a mixture of $Ta_2O_5$ and $TiO_2$, and the proportion of the number of Ti atoms relative to the total number of the number of Ta atoms and the number of Ti atoms in the mixture (Ti/(Ta+Ti)*100) is particularly preferably in the range of at least 4.0% to no more than 30%.

It should be noted that the phase difference of each of the plurality of birefringent films is not particularly limited, and can be optimized according to the desired phase difference.

The thickness of the optically anisotropic layer overall is not particularly limited, and can be optimized according to the desired phase difference.

Protective Layer Formation Step

The protective layer formation step in the manufacturing method of the phase difference element of the present invention is a step of forming a protective layer by depositing an inorganic compound by way of the atomic layer deposition (ALD) method, so as to contact the optically anisotropic layer obtained in the above-mentioned optically anisotropic layer formation step.

In the phase difference element obtained in the present invention, the protective layer covers a void part between columnar parts formed by oblique vapor deposition. According to the existence of a protective layer obtained by the protective layer formation step, even in a case of moisture infiltrating the void part between columnar parts, it is possible to suppress cracking and peeling, and realize a phase difference element superior in moisture resistance.

In the phase difference element 10 shown in FIG. 1, the protective layer 14 is provided on the optically anisotropic layer 13 to contact the optically anisotropic layer 13.

The inorganic compound serving as the raw material of the protective layer preferably contains at least one selected from the group consisting of $TiO_2$, $SiO_2$, $Ta_2O_5$, $Al_2O_3$, $ZrO_2$, $Nb_2O_5$ and $HfO_2$ from the viewpoint of improving moisture resistance.

In addition, the thickness of the protective layer, from the viewpoint of improving moisture resistance, is preferably at least 2 nm.

In addition, the protective layer may be a multilayer film of two or more layers from the viewpoint of improving moisture resistance.

It should be noted that the manufacturing method of the phase difference element of the present invention, from the viewpoint of improving moisture resistance, may alternately repeat a plurality of times the optically anisotropic layer formation step and protective layer formation step.

$SiO_2$ Layer Formation Step

The manufacturing method of the phase difference element of the present invention may have a $SiO_2$ layer formation step of forming a $SiO_2$ layer so as to contact the protective layer on the protective layer formed in the above-mentioned protective layer formation step, as necessary. The $SiO_2$ layer formation step may form the $SiO_2$ layer by way of a plasma CVD method on the protective layer.

In the phase difference element 10 of FIG. 1, the $SiO_2$ layer 17 is arranged between the protective layer 14 and antireflection layer 16 to contact the protective layer 14.

Antireflection Layer Formation Step

The manufacturing method of the phase difference element of the present invention may have an antireflection layer formation step of forming an antireflection layer on the outermost layer of layers constituting the phase difference element, as necessary. In the antireflection layer formation step, at least two dielectric films of different refractive index are laminated to form the antireflection layer.

Figure 2:
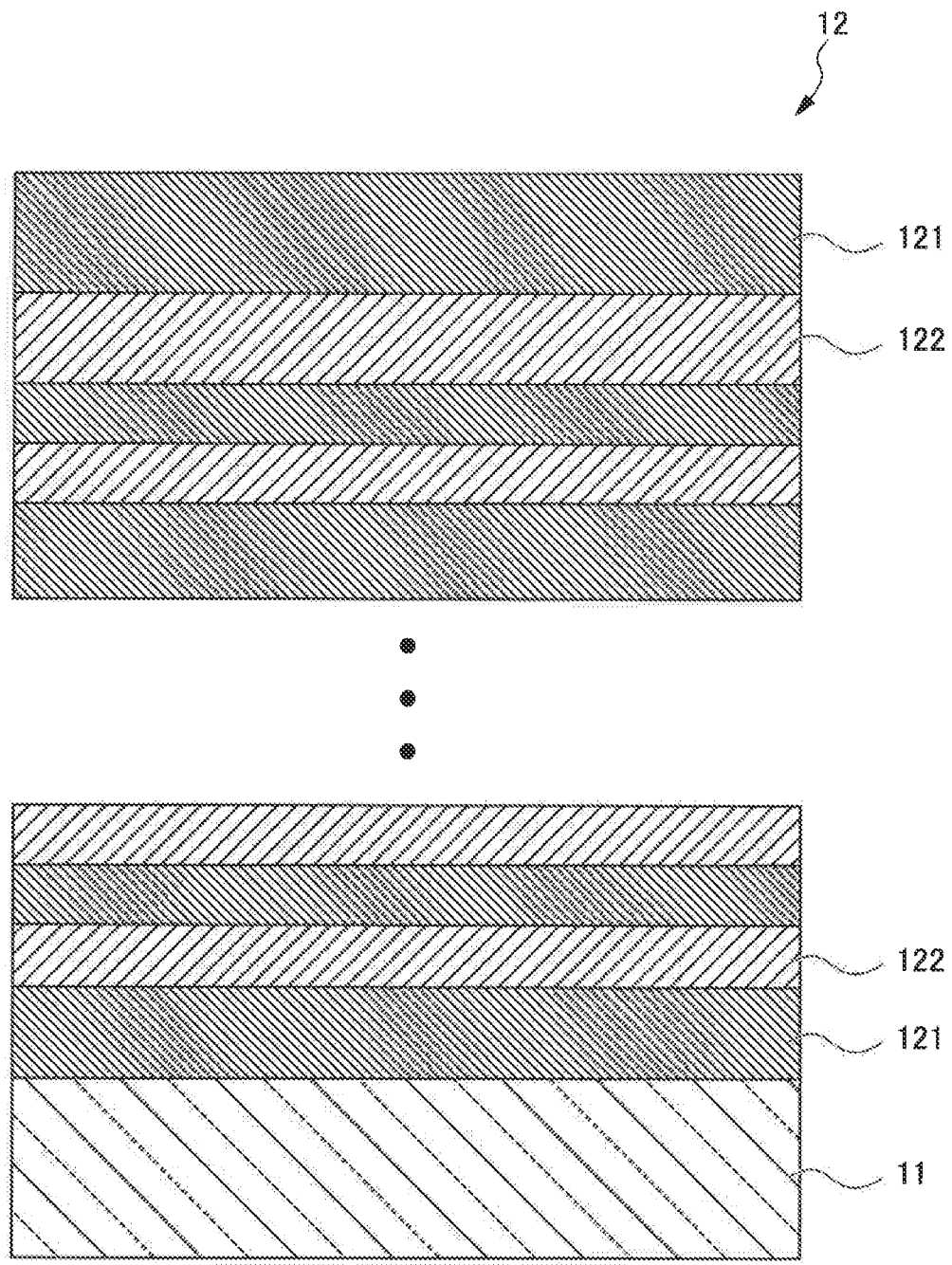
FIG. 2 is a cross-sectional schematic diagram of an antireflection layer according to an embodiment of the present invention.

FIG. 2 is a cross-sectional schematic diagram of the antireflection layer according to the embodiment. The antireflection layer 12 shown in FIG. 2 is a multilayer film formed by laminating two types of dielectric film of different refractive index. In the present embodiment, the antireflection layer 12 is configured by a dielectric multilayer film in which a first dielectric film 121 and second dielectric film 122 are alternately laminated. The number of layers is not particularly limited; however, a dielectric multilayer film is established with a total of about 5 to 40 layers in which the first dielectric film 121 and second dielectric film 122 are alternately laminated.

As the material constituting the dielectric film consisting of at least two dielectrics of different refractive index, inorganic oxides containing at least one selected from the group consisting of $TiO_2$, $SiO_2$, $Ta_2O_5$, $Al_2O_3$, $CeO_2$, $ZrO_2$, ZrO, $Nb_2O_5$ and $HfO_2$ can be exemplified for each. For example, in the antireflection layer 12 according to the embodiment shown in FIG. 2, it is preferable for the first dielectric film 121 to be formed with $Nb_2O_5$ which is relatively high refractive index, and the second dielectric film 12 to be formed with $SiO_2$ which is relatively low refractive index.

In the phase difference element 10 shown in FIG. 1, the first antireflection layer 12A is arranged to contact the transparent substrate 11 on the opposite face to the side of the transparent substrate 11 on which the birefringent layer 13 exists, and the second antireflection layer 12B is arranged to contact the $SiO_2$ layer 17 on the opposite face to the side of the $SiO_2$ layer 17 on which the protective layer 14 exists. In other words, the first antireflection layer 12A and second antireflection layer 12B are respectively provided on outermost layers of the phase difference element. The first antireflection layer 12A and second antireflection layer 12B have a function of reflection reduction in a desired wavelength band of use.

Matching Layer Formation Step

The manufacturing method of the phase difference element of the present invention may have a matching layer formation step of forming a matching layer so as to contact the transparent substrate, as necessary. The matching layer formation step forms a matching layer on a face on which the optically anisotropic layer is provided, so as to contact the transparent substrate.

The matching layer is a layer which prevents reflection at the interface between the transparent substrate and the optically anisotropic layer. The matching layer is provided between the transparent substrate and the optically anisotropic layer, for example, and is a multilayer film of dielectric. The matching layer is designed so as to negate interface reflected light between the transparent substrate and the matching layer, and interface reflected light between the matching layer and the optically anisotropic layer.

In the phase difference element 10 of FIG. 1, the matching layer 15 is arranged between the transparent substrate 11 and the optically anisotropic layer 13. According to the existence of the matching layer 15, the phase difference element 10 serves as an element in which reflection is further prevented.

Phase Difference Element

The phase difference element of the present invention is a phase difference element represented in the ½ wave plate or ¼ wave plate, and otherwise, contains various elements which can control phase difference, such as optical compensation elements. The phase difference element of the present invention includes a transparent substrate, an optically anisotropic layer containing birefringent film, and a protective layer which is an atomic layer deposited layer of inorganic compound that contacts the optically anisotropic layer.

The phase difference element of the present invention can be produced using the above-mentioned materials by way of the above-mentioned manufacturing method.

Projection Image Display Device

The projection image display device of the present invention is a projection image display device including the above-mentioned phase difference element. Furthermore, the projection image display device of the present invention has a light source which outputs light, a light modulation device, a projection optical system which projects the modulated light, and the above-mentioned phase difference element arranged in the light path between the light source and the projection optical system.

The light source outputs light and, for example, an extra-high pressure mercury lamp which outputs white light can be exemplified. The projection optical system projects the modulated light and, for example, a projector lens which projects the modulated light onto a screen can be exemplified.

As the light modulation device, a liquid crystal display device having a transflective liquid crystal panel, etc., a micromirror display device having DMD (Digital Micromirror Device), etc., a reflective liquid crystal display device having a reflective liquid crystal panel, etc., a one-dimensional diffractive display device having a one-dimensional diffractive light modulation device (GLV), etc. can be exemplified.

The projection optical system is not particularly limited so long as being a member which projects modulated light, and it is possible to select as appropriate according to the purpose. For example, a projector lens which projects the modulated light onto a screen can be exemplified.

In other words, the phase difference element of the present invention is an element superior in moisture resistance, and thus can be appropriately used in various image display devices and, for example, can be used appropriately in a projector application such as a liquid crystal projector, DLP (registered trademark) projector, LCOS projector, and GLV (registered trademark) projector.

It should be noted that the present invention is not to be limited to the above-mentioned embodiment, and that modifications and improvements within a scope that can achieve the objects of the present invention are also encompassed by the present invention.

EXAMPLES

Next, although examples of the present invention have been explained, the present invention is not to be limited to these examples.

Example 1

Fabrication of Phase Difference Element

Fabrication of Matching Layer

The matching layer was formed by preparing a glass substrate (average thickness 0.7 mm), and laminating on one face three layers of $SiO_2/Nb_2O_5/SiO_2$ by way of a sputtering method.

Fabrication of First Antireflection Layer

Next, on the other face of the glass substrate, the first antireflection layer was formed by alternately laminating ten layers by way of a sputtering method using $Nb_2O_5$ and $SiO_2$.

Fabrication of Optically Anisotropic Layer

Over the matching layer, the vapor deposition source was arranged at a position sloped by about 70 degrees relative to the substrate normal line direction with $Ta_2O_5$ as the vapor deposition material, a plurality of vapor deposition processes were conducted by oblique vapor deposition, and a plurality of birefringent films was formed, thereby forming the optically anisotropy layer to obtain the phase difference element.

Figure 5:
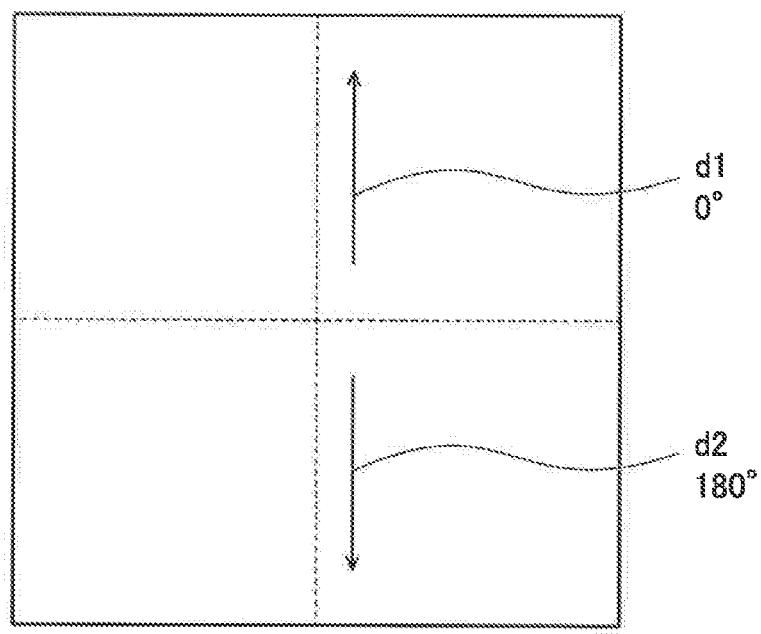
FIG. 5 is a view showing a film formation direction of Example 1.

FIG. 5 shows the angle of each vapor deposition process in an in-plane direction. In a vapor deposition process 1, as shown in FIG. 5, in the case of defining the xy axis on the vapor deposition plane and defining the clock-wise direction from center as +, the oblique vapor deposition was conducted from the direction of 0 degrees, and the birefringent film 1 was formed. Next, as the vapor deposition process 2, vapor deposition was conducted from the direction of 180 degrees, and the birefringent film 2 was formed. After alternately repeating this, a optically anisotropic layer having a plurality of birefringent films was obtained by performing an annealing process at 300° C. for stabilizing the characteristics.

Fabrication of Protective Layer

On the obtained optically anisotropic layer, a protective layer was formed by depositing $SiO_2$ in 2 nm thickness by the atomic layer deposition method.

Fabrication of Second Antireflection Layer

Finally, using $Nb_2O_5$ and $SiO_2$, a second antireflection layer was formed by alternately laminating seven layers by the sputtering method to obtain the phase difference element.

Comparative Example 1

A phase difference element was fabricated similarly to Example 1 except for conducting the fabrication of a $SiO_2$ layer serving as the protective layer by the plasma CVD method using TEOS (tetraethoxysilane) gas and $O_2$ in place of the atomic layer deposition method.

Moisture Resistance Experiments

Thirty of each of the phase difference elements of Example 1 and Comparative Example 1 were prepared, and the damage conditions after left standing for 1000 hours under 85° C. and 85% RH were compared. Damage was judge by whether or not peeling of the birefringent film of the optically anisotropic layer was present.

TABLE 1

|  | Example 1 | Comparative Example 1 |
| --- | --- | --- |
| Damage count/number of tests | 0/30 | 30/30 |

The phase difference element by the manufacturing method of the present invention is found to be remarkably superior in moisture resistance compared to the phase difference element by the protective layer formed by the CVD method, due to having the protective layer formed by the atomic layer deposition method.

EXPLANATION OF REFERENCE NUMERALS

10 phase difference element
11 transparent substrate
12A first antireflection layer
12B second antireflection layer
121 first dielectric film
122 second dielectric film
13 optically anisotropic layer
13 birefringent film
14 protective layer
15 matching layer
17 $SiO_2$ layer
S substrate normal line
D film formation direction of birefringent film
D orientation of line segment projecting film formation direction of birefringent film onto surface of transparent substrate

What is claimed is:

1. A manufacturing method of a phase difference element, the phase difference element including a transparent substrate, an optically anisotropic layer containing a birefringent film, and a protective layer, the method comprising:
an optically anisotropic layer formation step of forming an optically anisotropic layer by forming a birefringent film; and
a protective layer formation step of forming a protective layer by depositing an inorganic compound by way of an atomic layer deposition method so as to contact the optically anisotropic layer.

2. The manufacturing method of a phase difference element according to claim 1, wherein the optically anisotropic layer is formed by oblique vapor deposition in the optically anisotropic layer formation step.

3. The manufacturing method of a phase difference element according to claim 1, wherein the optically anisotropic layer at least contains $Ta_2O_5$ or $HfO_2$.

4. The manufacturing method of a phase difference element according to claim 1,
wherein the optically anisotropic layer consists of a mixture of $Ta_2O_5$ and $TiO_2$, and
wherein a proportion of a number of Ti atoms relative to a total of the number of Ti atoms and a number of Ta atoms (Ti/(Ta+Ti)*100) is set to at least 4.0% and no more than 30%.

5. The manufacturing method of a phase difference element according to claim 1, wherein the inorganic compound contains at least one selected from the group consisting of $TiO_2$, $SiO_2$, $Ta_2O_5$, $Al_2O_3$, $ZrO_2$, $Nb_2O_5$ and $HfO_2$.

6. The manufacturing method of a phase difference element according to claim 1, wherein the thickness of the protective layer is at least 2 nm.

7. The manufacturing method of a phase difference element according to claim 1, wherein the protective layer consists of at least two layers.

8. The manufacturing method of a phase difference element according to claim 1, wherein the method alternately repeats for a plurality of times the optically anisotropic layer formation step and the protective layer formation step.

9. The manufacturing method of a phase difference element according to claim 1, further comprising a $SiO_2$ layer formation step of forming a layer consisting of $SiO_2$ on the protective layer.

10. The manufacturing method of a phase difference element according to claim 9, wherein the layer consisting of $SiO_2$ is formed by a plasma CVD method in the $SiO_2$ layer formation step.

11. The manufacturing method of a phase difference element according to claim 1, further comprising an antireflection layer formation step of laminating at least two types of dielectric films of different refractive index to form an antireflection layer.

12. The manufacturing method of a phase difference element according to claim 11, wherein the dielectric film contains at least one selected from the group consisting of $TiO_2$, $SiO_2$, $Ta_2O_5$, $Al_2O_3$, $CeO_2$, $ZrO_2$, $ZrO$, $Nb_2O_5$ and $HfO_2$.

13. The manufacturing method of a phase difference element according to claim 1, further comprising a matching layer formation step of forming a matching layer so as to contact the transparent substrate.

14. The manufacturing method of a phase difference element according to claim 1, wherein the transparent substrate is one selected from the group consisting of glass, quartz, crystal and sapphire.

15. A phase difference element comprising:
a transparent substrate;
an optically anisotropic layer containing a birefringent film; and
a protective layer which is an atomic layer deposited layer of inorganic compound contacting the optically anisotropic layer.

16. The phase difference element according to claim 15, wherein the birefringent film is a obliquely vapor deposited film.

17. A projection image display device comprising the phase difference element according to claim 15.

18. A projection image display device comprising:
a light source which outputs light;
a light modulation device;
a projection optical system which projects modulated light; and
the phase difference element according to claim 15 which is disposed in a light path between the light source and the projection optically system.

19. The manufacturing method of a phase difference element according to claim 2, wherein the optically anisotropic layer at least contains $Ta_2O_5$ or $HfO_2$.

20. The manufacturing method of a phase difference element according to claim 2,
- wherein the optically anisotropic layer consists of a mixture of $Ta_2O_5$ and $TiO_2$, and
- wherein a proportion of a number of Ti atoms relative to a total of the number of Ti atoms and a number of Ta atoms (Ti/(Ta+Ti)*100) is set to at least 4.0% and no more than 30%.

* * * * *